United States Patent
Lee et al.

(10) Patent No.: US 11,269,422 B2
(45) Date of Patent: Mar. 8, 2022

(54) FORCE SENSING DEVICE AND ELECTRONIC DEVICE INCLUDING FORCE SENSING DEVICE

(71) Applicant: Samsung Electro-Mechanics Co., Ltd., Suwon-si (KR)

(72) Inventors: Chang Ju Lee, Suwon-si (KR); Gye Won Lee, Suwon-si (KR); Jong Yun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/990,204

(22) Filed: Aug. 11, 2020

(65) Prior Publication Data

US 2021/0333886 A1     Oct. 28, 2021

(30) Foreign Application Priority Data

Apr. 24, 2020   (KR) .................. 10-2020-0050094

(51) Int. Cl.
    *G06F 3/02*     (2006.01)
(52) U.S. Cl.
    CPC .................. *G06F 3/0202* (2013.01)
(58) Field of Classification Search
    CPC ......... H04M 1/72466; H04M 1/72424; H04M 1/72469; H04M 1/0279; H04M 1/236; H04M 1/026; H04M 2250/22; G06F 3/03547; G06F 2203/0339; G06F 3/023; G06F 3/0202
    See application file for complete search history.

(56) References Cited

U.S. PATENT DOCUMENTS

| | | | |
|---|---|---|---|
| 2011/0226599 A1* | 9/2011 | Xiao | H04M 1/236 200/341 |
| 2019/0035572 A1* | 1/2019 | Noh | H01H 13/10 |
| 2020/0371659 A1* | 11/2020 | Kim | G06F 3/0447 |

FOREIGN PATENT DOCUMENTS

| | | |
|---|---|---|
| CN | 207902420 U | 9/2018 |
| KR | 10-1233021 B1 | 2/2013 |
| KR | 10-2020-0009204 A | 1/2020 |
| WO | WO 2010/014356 A2 | 2/2010 |

OTHER PUBLICATIONS

Korean Office Action dated Jun. 10, 2021 in counterpart Korean Patent Application No. 10-2020-0050094 (5 pages in English and 4 pages in Korean).

* cited by examiner

*Primary Examiner* — Amit Chatly
(74) *Attorney, Agent, or Firm* — NSIP Law (57) ABSTRACT

A force sensing device includes: a sensor support portion; at least one force sensor disposed on a first surface side of the sensor support portion; a frame disposed on a second surface side of the sensor support portion and spaced apart from the sensor support portion; and a pressure applying member disposed between the sensor support portion and the frame, and configured to apply pressure to the sensor support portion.

20 Claims, 8 Drawing Sheets

FORCE SENSING DEVICE AND ELECTRONIC DEVICE INCLUDING FORCE SENSING DEVICE

CROSS-REFERENCE TO RELATED APPLICATIONS

This application claims the benefit under 35 U.S.C. § 119(a) of Korean Patent Application No. 10-2020-0050094 filed on Apr. 24, 2020 in the Korean Intellectual Property Office, the entire disclosure of which is incorporated herein by reference for all purposes.

BACKGROUND

1. Field

The following description relates to a force sensing device and an electronic device including a force sensing device.

2. Description of Related Art

Portable terminal devices such as laptops, smartphones, smartpads, and the like, may include a display providing information to a user and an input means.

For such portable terminal devices, a technique of using a force sensing device as an input means, instead of using a traditionally used mechanical button, has been researched in order to improve a design and performance characteristics such as waterproofness and dustproofness.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a force sensing device includes: a sensor support portion; at least one force sensor disposed on a first surface side of the sensor support portion; a frame disposed on a second surface side of the sensor support portion and spaced apart from the sensor support portion; and a pressure applying member disposed between the sensor support portion and the frame, and configured to apply pressure to the sensor support portion.

The at least one force sensor may be configured to recognize an input signal based on changes in a distance to a pressing surface disposed side-by-side with a sensing surface of the at least one force sensor. The force sensing device may further include a plurality of support projections disposed between the sensor support portion and the pressing surface, and spacing the sensing surface of the at least one force sensor apart from the pressing surface.

The sensor support portion may include a support plate on which the at least one force sensor is seated. The plurality of support projections may protrude from the support plate.

The plurality of support projections may be disposed to be line-symmetrical or point-symmetrical to each other with respect to a center of the at least one force sensor.

The pressure applying member may protrude from the frame in a cantilever shape.

When the pressure applying member is in contact with the sensor support portion, a surface of the pressure applying member may become a curved surface.

The force sensing device may further include: a frame coupling portion extending from the sensor support portion and coupled to one surface of the frame.

The force sensing device may further include: at least one button disposed on one side of the frame coupling portion.

A thickness of a portion of the frame coupling portion on which the button is disposed may be greater than a thickness of a portion of the sensor support portion on which the at least one force sensor is disposed.

The at least one force sensor may include a plurality of force sensors disposed on the first surface side of the sensor support portion. At least one support projection among the plurality of support projections may be disposed along a boundary between the plurality of force sensors.

The pressure applying member may be disposed to be in contact with a portion of the sensor support portion that does not oppose the at least one force sensor.

The sensor support portion may have a plate shape.

In another general aspect, an electronic device includes: an accommodation member including a first side wall and a second side wall disposed opposite to the first side wall and having a shape configured to change by external force; and a force sensing device disposed in the accommodation member. The force sensing device includes: a sensor support portion spaced apart from the first side wall and having at least a portion in contact with the second side wall; and at least one force sensor coupled to the sensor support portion. A sensing surface of the at least one force sensor is disposed opposite to the second side wall and is spaced apart from the second side wall.

The electronic device may further include: a plurality of support projections disposed between the sensor support portion and the second side wall and spacing the sensing surface of the at least one force sensor apart from the second side wall.

The electronic device may further include: a frame coupling portion extending from the sensor support portion; and at least one button disposed on one side of the frame coupling portion.

The button may penetrate the second side wall, and at least one portion of the button may be exposed externally of the second side wall.

In another general aspect, a force sensing device includes: a sensor support portion; a force sensor disposed on a first side of the sensor support portion; and a frame disposed on a second side of the sensor support portion, opposite the first side, and comprising at least one elastic pressure applying member. The at least one elastic pressure applying member is configured to apply pressure to the sensor support portion and space a remaining portion of the frame apart from the sensor support portion.

The at least one elastic pressure applying member may have a plate spring shape or a cantilever spring shape, and may be integrally formed with the remaining portion of the frame or fastened to the remaining portion of the frame.

The force sensor may be configured to recognize an input signal based on changes in a distance to a pressing surface opposing a sensing surface of the force sensor. The force sensing device may further include a plurality of support projections disposed between the sensor support portion and the pressing surface, and spacing the sensing surface of the force sensor apart from the pressing surface.

The force sensor may be disposed inward of the plurality of support projections. The at least one elastic pressure applying member may include a plurality of elastic pressure applying members aligned with the plurality of support projections.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
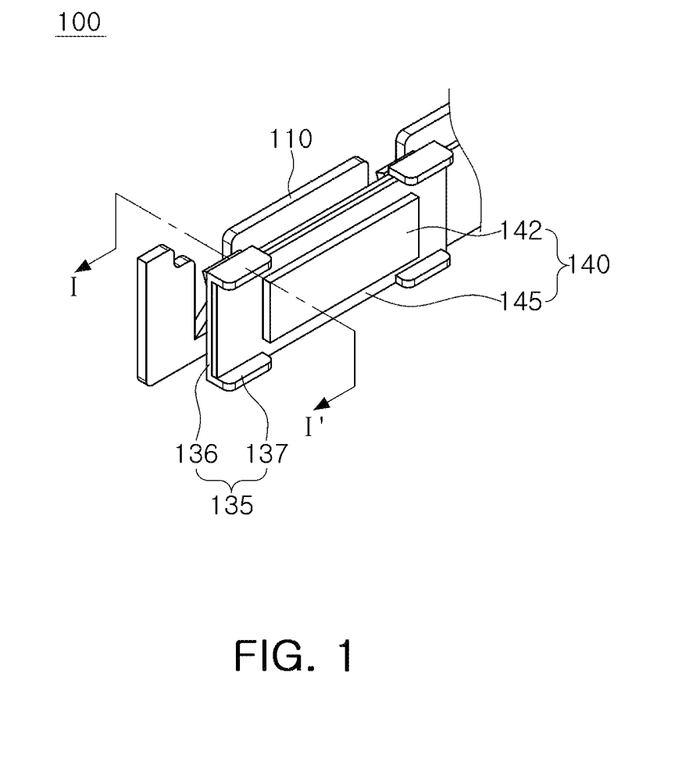
FIG. 1 is a perspective diagram illustrating a force sensing device, according to an embodiment.
Figure 2:
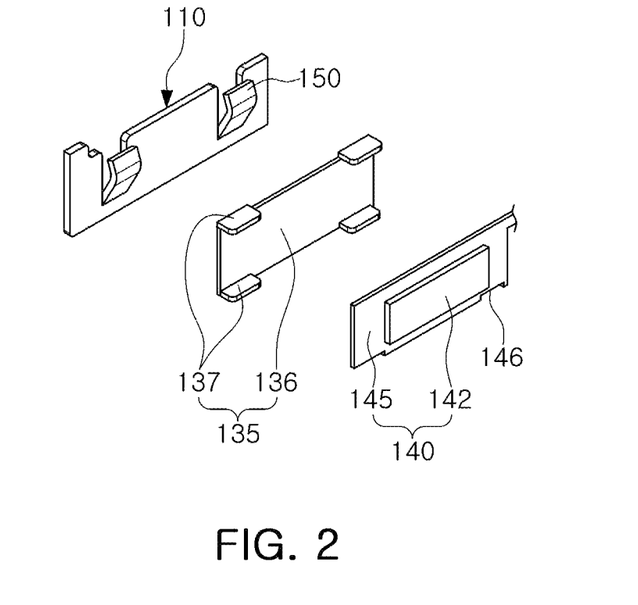
FIG. 2 is an exploded perspective diagram illustrating the force sensing device illustrated in FIG. 1.
Figure 3:
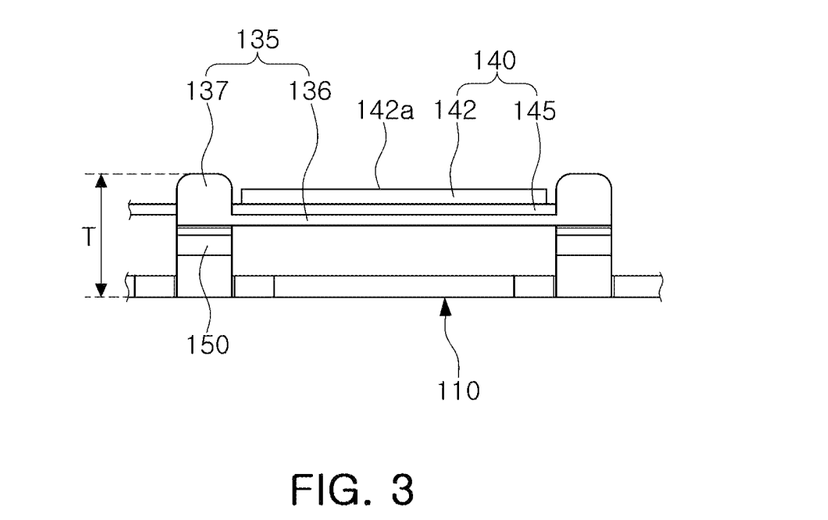
FIG. 3 is a plan diagram illustrating the force sensing device illustrated in FIG. 1.

FIG. 1 is a perspective diagram illustrating a force sensing device 100, according to an embodiment. FIG. 2 is an exploded perspective diagram illustrating the force sensing device 100. FIG. 3 is a plan diagram illustrating the force sensing device 100.

Referring to FIGS. 1 to 3, the force sensing device 100 may include, for example, a sensor portion 140, a sensor support portion 135, a frame 110, and a pressure applying member 150.

The sensor portion 140 may include at least one force sensor 142 and may include a connection portion 145 for electrically connecting the sensor portion 140 to an electronic device on which the force sensing device 100 is mounted to the force sensor 142.

A circuit substrate, such as an FPCB or a PCB, may be used as the connection portion 145.

In an example, a plurality of force sensors 142 may be spaced apart from each other and may be mounted on a first surface of the connection portion 145.

The force sensor 142 may include a sensing coil. For example, the force sensor 142 may be a sensor configured to sense changes in a distance between the sensing coil and a displacement member (e.g., a case of the electronic device on which the force sensing device is mounted, or a portion of the case).

A shape of the sensing coil is not limited to any particular shape, and may have various shapes such as a circular shape, a rectangular shape, or the like. The sensing coil may also be a wiring pattern in a PCB or a FPCB, or may be a chip inductor.

The force sensor 142 may sense changes in a shape of a displaceable object by force applied to the displacement object. For example, when a user applies pressure to (e.g., presses on) one surface (hereinafter, a pressing surface) of a case, the pressing surface may be bent, and accordingly, a distance between the sensing coil used for resonance and the pressing surface, which is a displacement member, may change.

By the changes in the distance between the sensing coil and the pressing surface, a magnitude of an eddy current generated on the side of the pressing surface may change, and accordingly, there may be a change in inductance of the sensing coil. Accordingly, the force sensing device 100 may sense changes in pressure based on the change in inductance, and may recognize the change as an input signal.

The sensor support portion 135 may be coupled to the sensor portion 140 and may allow the force sensor 142 of the sensor portion 140 to be spaced apart from the displacement member. To this end, the sensor support portion 135 may include a support plate 136 and a support projection 137.

The support plate 136 may have a planar plate shape, and may be a metal plate, for example.

The support plate 136 may be disposed on a second surface of the connection portion 145, opposite to the first surface of the connection portion 145, and may be coupled to the connection portion 145. To establish stable coupling, an adhesive member may be interposed between the support plate 136 and the connection portion 145.

The support plate 136 may be disposed to oppose a frame 110. For example, the support plate 136 may be disposed side by side with the connection portion 145 and the frame 110, between the connection portion 145 and the frame 110.

The force sensor 142 may be disposed in a region of the connection portion 145 coupled to the support plate 136. Accordingly, the sensor support portion 135 may be disposed to oppose the force sensor 142 with the connection portion 145 interposed between the sensor support portion 135 and the force sensor 142.

The sensor support portion 135 may have an area greater than an area of the force sensor 142. An area of the sensor support portion 135 may be prescribed in consideration of a size of the pressure applying member 150. For example, the pressure applying member 150 may be configured to be in contact with the sensor support portion 135. The pressure applying member 150 may be in contact with a region of the sensor support portion 135 disposed on an external side of the force sensor 142, rather than a region of the sensor support portion 135 opposing the force sensor 142. Accordingly, an externally extending portion of the sensor support portion 135 extending externally from a side of the force sensor 142 may have a size such that the externally extending portion of the sensor support portion 135 may be stably in contact with and pressured by the pressure applying member 150.

In the description of the example embodiment, the region opposing the force sensor 142 may be a region in which, when the area occupied by the force sensor 142 is projected on a first surface of the sensor support portion 135, the force sensor 142 overlaps the sensor support portion 135. Accordingly, the externally extending portion of the sensor support portion 135 extending externally from the side of the force sensor 142 may be to a region in which the projected force sensor 142 does not overlap the sensor support portion 135.

The support projection 137 may be disposed between the support plate 136 and a second side wall 15 of an accommodation space of an accommodation member 10 (FIGS. 4 and 5) and may allow a sensing surface 142*a* of the force sensor and the second side wall 15 to be spaced apart from each other.

The support projection 137 may protrude on the support plate 136 in a direction perpendicular to the support plate 136. The sensor portion 140 may be coupled to the first surface of the sensor support portion 135. Accordingly, the support projection 137 may be configured to protrude from an edge of the sensor support portion 135 to not interfere with the connection portion 145.

A plurality of support projections 137 may be disposed around the connection portion 145 and may be spaced apart from each other. Accordingly, the connection portion 145 may be disposed in an internal region bounded by, or disposed inward from the support projections 137. Also, in an example, the support projections 137 may be disposed in a position in which the support projections 137 are line-symmetrical or point-symmetrical to each other with respect to a center of the force sensor 142.

The support projections 137 may prevent the force sensor 142 from being in contact with a displacement member by allowing the displacement member to be spaced apart from the force sensor 142 by the support projections 137. Accordingly, the support projections 137 may be configured to have a thickness greater than a thickness of the sensor portion 140 in a portion in which the force sensor 142 is disposed.

Figure 4:
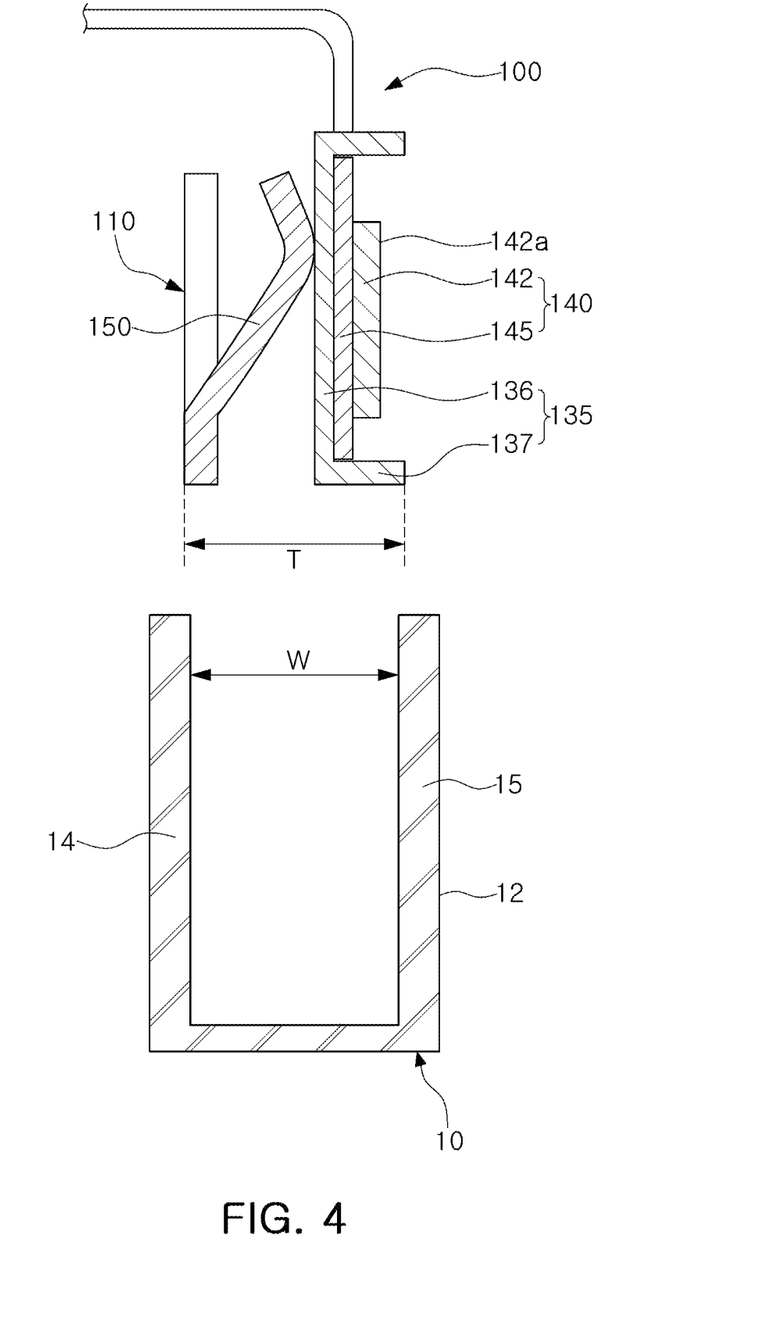
FIGS. 4 and 5 are cross-sectional diagrams illustrating an electronic device including the force sensing device illustrated in FIG. 1 mounted thereon, according to an embodiment.
Figure 5:
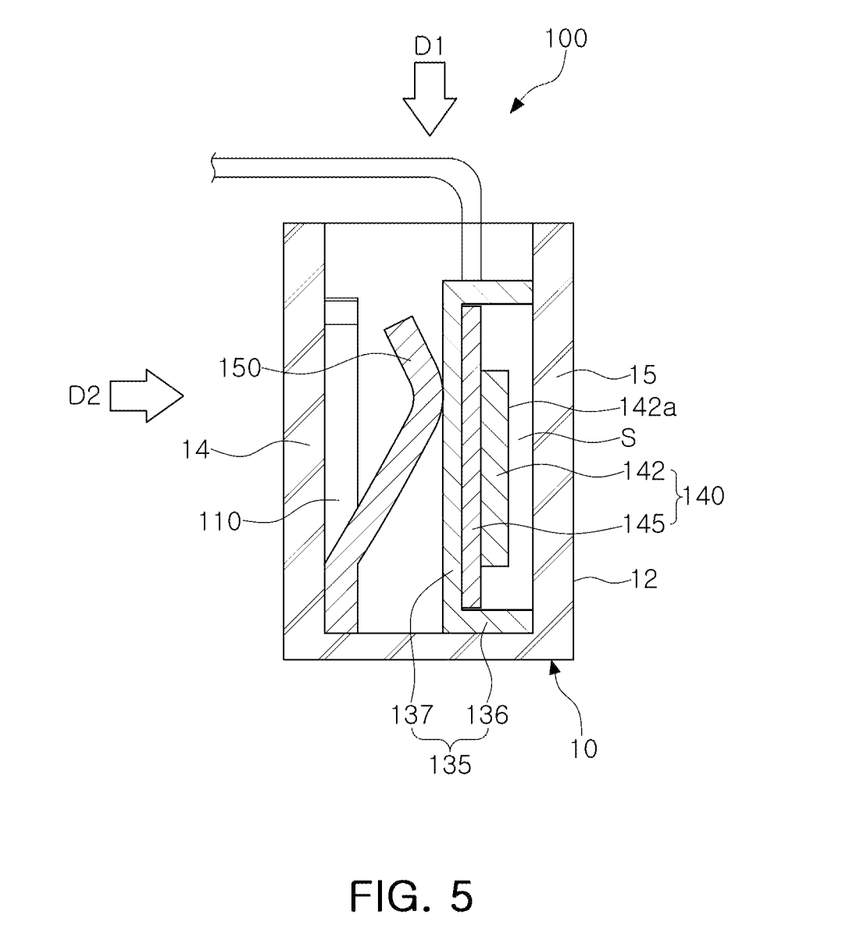

FIGS. 4 and 5 are cross-sectional diagrams illustrating an electronic device including the force sensing device 100 mounted thereon, according to an embodiment. FIG. 4 is a cross-sectional diagram illustrating a state in which the force sensing device 100 is uncoupled from the electronic device, and FIG. 5 is a cross-sectional diagram illustrating a state in which the force sensing device 100 is coupled to the electronic device.

In the electronic device, only the accommodation member 10 in which the force sensing device 100 is accommodated is illustrated for ease of description. Also, a cross-sectional surface of the force sensing device 100 taken long line I-I' in FIG. 1 is illustrated.

The accommodation member 10 may include the accommodation space in which the force sensing device 100 is accommodated, and the accommodation space may include a first side wall 14, and the second side wall 15 disposed to oppose the first side wall 14. The second side wall 15 may be a portion of which a shape is changed by external force, such as a force applied from a user, and may be a portion of an electronic device case, for example.

When the force sensing device 100 is inserted into the accommodation member 10 provided in the electronic device, the sensor support portion 135 to which the sensor portion 140 is coupled may be pressed to the second side wall 15 side by the pressure applying member 150. In this case, the force sensor 142 may be spaced apart from the second side wall 15 by the support projection 137.

As illustrated in FIG. 5, the support projection 137 may protrude from the support plate 136 by a distance greater than a thickness of the sensor portion 140. Accordingly, when an end of the support projection 137 is in contact with the second side wall 15, an empty space S may be secured between the force sensor 142 and the second side wall 15. Thus, a sensing surface 142a of the force sensor 142 may be prevented from being directly in contact with the second side wall 15.

In an example, the support projections 137 may be configured to respectively protrude on four corner portions of the support plate 136, which may be a plate-shaped member having a rectangular shape. For the support projection 137 to prevent interference with the connection portion 145, the connection portion 145 may include a groove 146 (in FIG. 2) in which the support projection 137 is disposed. However, the disclosure is not limited to this example, and configurations of the support projections 137 and the connection portion 145 may be varied. For example, the support projection 137 may be disposed to penetrate through the connection portion 145. Since the support projections 137 configured as above may support the second side wall 15 on each edge portion of the force sensor 142, spacing distances among the sensing surface 142a of the force sensor 142, an entire element, and the second side wall 15 may be maintained to be the same. Accordingly, an issue of the force sensor 142 being inclined when disposed in the accommodation member 10, and other issues, may be prevented.

The frame 110 may have a planar plate-shaped member, and may include a first surface and a second surface opposing the first surface.

The sensor support portion 135 may be disposed on the first surface side of the frame 110. The frame 110 may be spaced apart from the sensor support portion 135 by a specified distance, and the pressure applying member 150 may be disposed between the frame 110 and the sensor support portion 135.

Accordingly, a spacing distance between the frame 110 and the sensor support portion 135 may change by force applied to the pressure applying member 150.

The frame 110 may be formed of a metal material, but is not limited thereto.

As described above, the force sensing device 100 may be inserted into the accommodation member 10 in direction D1 to be disposed in the accommodation member 10, as illustrated in FIG. 5. In this case, sensing efficiency of the force sensor 142 may degrade when a distance between the force sensor 142 and a pressing surface 12 is not maintained to be constant by an assembly tolerance and a manufacturing tolerance.

Accordingly, a spacing distance between the force sensor 142 and the second side wall 15 of the accommodation member 10 may need to be maintained to be constant, and to this end, the force sensing device 100 may include the pressure applying member 150.

The pressure applying member 150 may protrude to the first surface side of the frame 110 and may press against the sensor support portion 135, in which the force sensor 142 is disposed. Accordingly, the sensor support portion 135 may be pressed in direction D2, as shown in FIG. 5, such that a state in which the support projection 137 is closely in contact with the second side wall 15 of the accommodation member 10 may be maintained.

Referring to FIG. 4, a width W of the internal space of the accommodation member 10 may be slightly less than a maximum thickness T (in FIG. 4) of the force sensing device 100 such that a state in which the sensor support portion 135 is closely in contact with the second side wall 15 may be maintained.

Accordingly, in the force sensing device 100, the pressure applying member 150 may be inserted into and disposed in an internal space of the accommodation member 10 in a state in which a shape of the pressure applying member 150 is elastically changed, and a state in which the sensor support portion 135 is closely in contact with the second side wall 15 by recovery force of the pressure applying member 150 may be maintained.

The width W of the internal space of the accommodation member 10 may be a shortest distance between the first side wall 14 and the second side wall 15. Also, a thickness T of the force sensing device 100 may be a shortest distance between an external surface of the frame 100 and an end of the support projection 137.

In an example, the pressure applying member 150 may be formed by partially cutting the frame along a shape of the pressure applying member 150. Accordingly, the pressure applying member 150 may be formed as a portion protruding to the sensor portion 140 side by bending the cut out portion of the frame 110.

Accordingly, one side of the pressure applying member 150 may be formed as a plate spring shape or a cantilever spring shape fastened to the frame 110 and may be integrated with the frame 110. Also, one end of the pressure applying member 150 may be connected to the frame 110, and the other end of the pressure applying member 150 may be spaced apart from a plane formed by the frame by a specified distance.

However, pressure applying member 150 is not limited to the example described above. For example, if desired, the pressure applying member 150 may be arranged as a separate member, and may be attached to a first surface of the frame 110 or may be inserted into and coupled to the frame 110.

Referring to FIGS. 2 and 5, a portion of the pressure applying member 150 in contact with the sensor support portion 135 may be configured to have a curved surface, and may be configured to be in line-contact with the sensor support portion 135. Accordingly, friction force with the sensor support portion 135 may be reduced. However, the disclosure is not limited to this configuration. A contact surface may be configured to have a planar plate shape such that the pressure applying member 150 may be in surface-contact with the sensor support portion 135, or at least one projection may be disposed on the contact surface such that the pressure applying member 150 is in point-contact with the sensor support portion 135.

A plurality of the pressure applying members 150 may be spaced apart from one another. Referring to FIG. 2, in the force sensing device 100, two pressure applying members 150 may be disposed to pressure a single sensor support portion 135. However, the force sensing device 100 is not limited to this example. For example, one or three or more of the pressure applying members 150 may be configured to pressure the sensor support portion 135. Also, a pressure applying position of the pressure applying members 150 may also be varied, if desired.

Also, as described above, the pressure applying members 150 may be disposed to be in contact with the sensor support portion 135 in a region that does not oppose the force sensor 142.

If the pressure applying member 150 were disposed in a region opposing the force sensor 142, pressing force applied by the pressure applying member 150 may be directly transferred to the force sensor 142 and, accordingly, a shape of the force sensor 142 may be changed.

Also, if the pressure applying member 150 were disposed in a region opposing the force sensor 142 and if there were a difference in elastic forces provided by each pressure applying member 150, spacing distances between the force sensors 142 and the pressing surface 12 may also be different.

However, in the force sensing device 100, the pressure applying member 150 may apply pressure (e.g., a pressing force) to a region corresponding to a peripheral region around the force sensor 142, rather than a region in which the force sensor 142 is disposed, such that a change in a shape of the force sensor 142 may be prevented, and a distance between the force sensors 142 and the pressing surface 12 may be maintained to be constant.

However, the disclosure is not limited to the foregoing example. In an example in which the sensor support portion 135 is not bent even when pressure is applied by the pressure applying member 150, the pressure applying member 150 may be disposed in a region opposing the force sensor 142.

The force sensing device 100 described above may be coupled to the electronic device by being inserted into the accommodation member 10 provided in the electronic device. Accordingly, the force sensing device 100 may be easily assembled and coupled to the electronic device.

Also, sensing sensitivity of the force sensor 142 may improve using the pressure applying member 150.

When the pressure applying member 150 is not provided, it may be difficult to maintain a constant distance between the force sensor 142 and the pressing surface 12, such that force sensing efficiency may degrade. Accordingly, by inserting a structure having no elasticity into a space between the sensor support portion 135 and the frame 110, the sensor support portion 135 may be closely in contact with the second side wall 15 of the accommodation member 10.

In this case, even when the pressing surface 12 is pressured, the support projections 137 or the sensor support portion 135 may not move to the first side wall 14 side, and accordingly, the force sensing may be functional only by changing a shape of a narrow region of the second side wall 15 disposed between the support projections 137. Accordingly, a shape of the pressing surface 12 may not be easily changed, and displacement may decrease significantly, such that force sensing sensitivity may degrade.

However, in the force sensing device 100, by disposing the pressure applying member 150 between the force sensor 142 and the frame 110, sensing sensitivity of the force sensor 142 may improve.

Figure 6A:
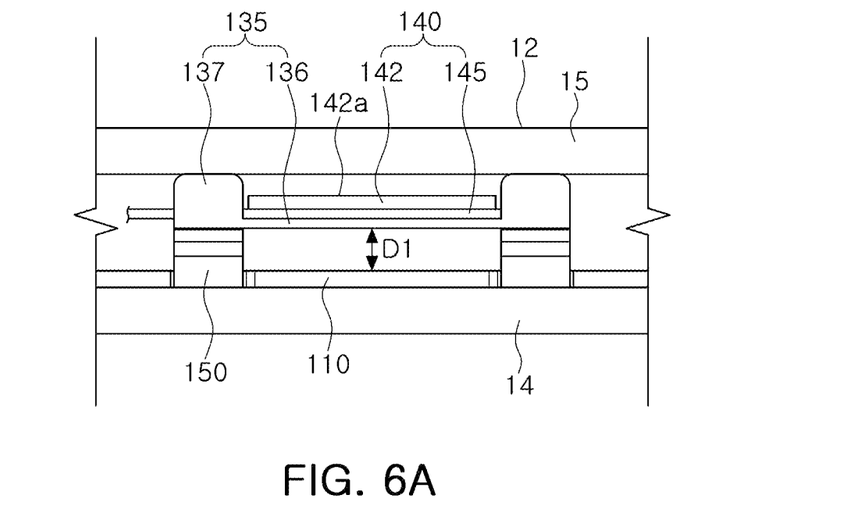
FIGS. 6A and 6B are plan diagrams illustrating the electronic device illustrated in FIG. 5.
Figure 6B:
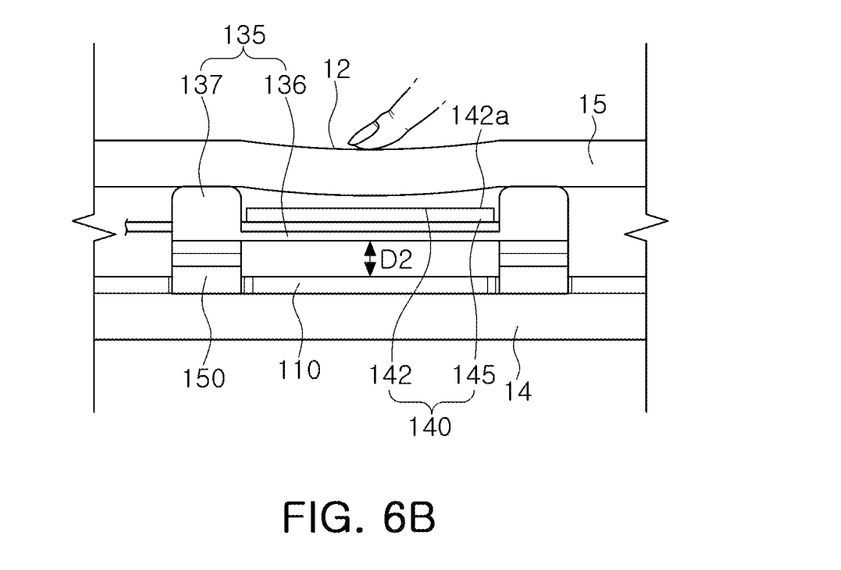

FIGS. 6A and 6B are plan diagrams illustrating the electronic device illustrated in FIG. 5. FIG. 6A illustrates a state in which force is not applied to the pressing surface 12, and FIG. 6B illustrates a state in which force has been applied to the pressing surface 12.

When the pressure applying member 150 is disposed between the force sensor 142 and the frame 110, as in the example embodiment, a distance between the sensor support portion 135 and the first side wall 14 may be maintained at D1. Also, as illustrated in FIG. 6A, when a user presses the pressing surface 12 (the second side wall 15), the pressure applying member 150 may be compressed by the pressing force of the user. In this process, the force sensor 142 and the sensor support portion 135 may move to the first side wall 14 side of the accommodation member 10 such that the distance between the sensor support portion 135 and the first side wall 14 may decrease to D2.

As described above, in the force sensing device 100, the force sensor 142 and the sensor support portion 135 may move to the first side wall 14 side by external force. Accordingly, a shape of the second side wall 15 may change within a relatively wide range as compared to an example in which no pressure applying member is provided, and a shape of the pressing surface 12 may also be easily changed. Accordingly, overall displacement may increase such that force sensing sensitivity may increase.

The force sensing device 100 is not limited to the aforementioned example embodiment, and may be varied.

Figure 7:
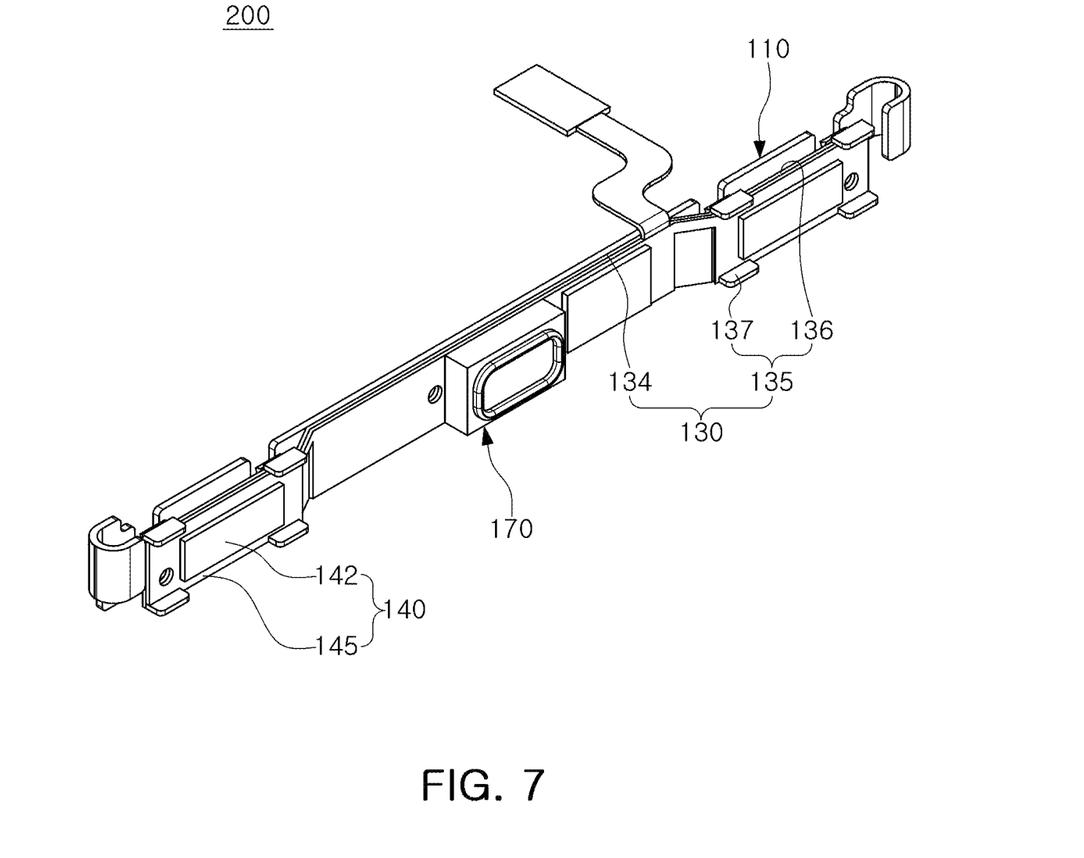
FIG. 7 is a perspective diagram illustrating a force sensing device, according to an embodiment.
Figure 8:
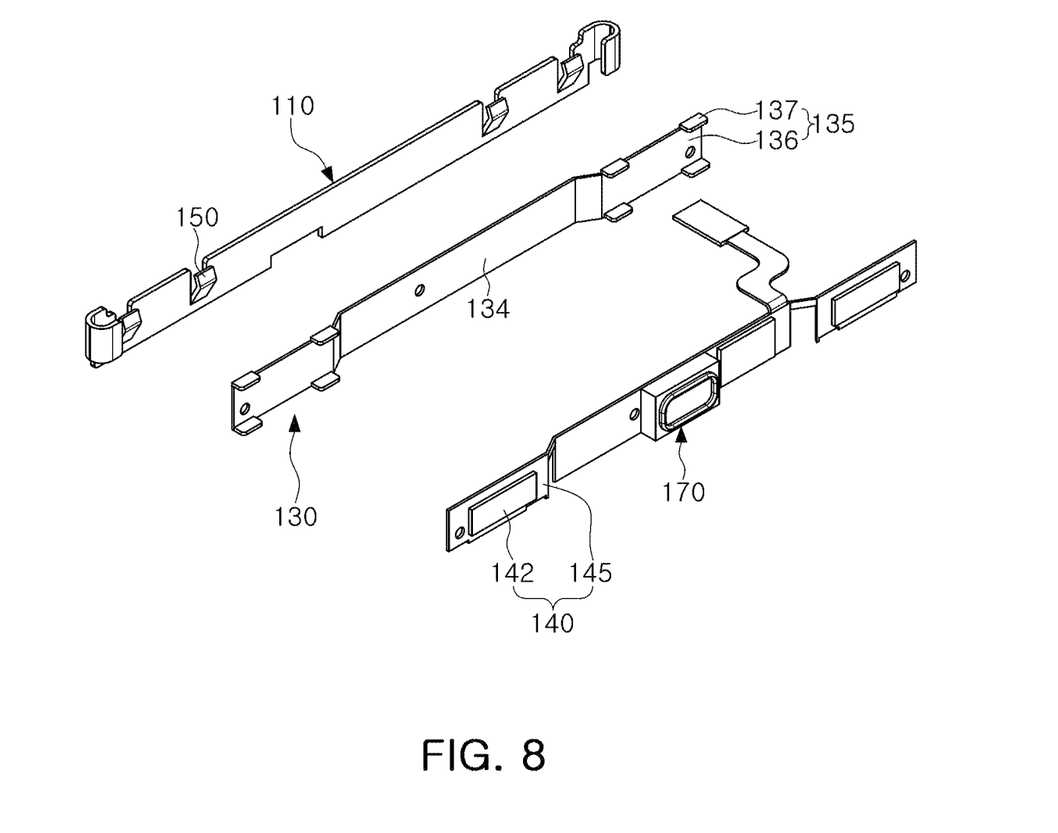
FIG. 8 is an exploded perspective diagram illustrating the force sensing device illustrated in FIG. 7.
Figure 9:
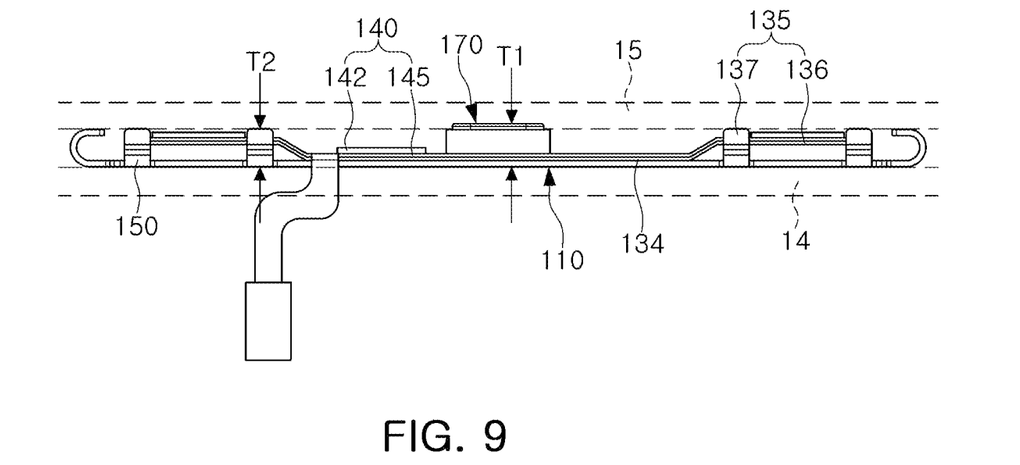
FIG. 9 is a plan diagram illustrating the force sensing device illustrated in FIG. 7.

FIG. 7 is a perspective diagram illustrating a force sensing device 200, according to an embodiment. FIG. 8 is an exploded perspective diagram illustrating the force sensing device 200. FIG. 9 is a plan diagram illustrating the force sensing device 200.

Referring to FIGS. 7 to 9, the force sensing device 200 may include, for example a support member 130 including at least one sensor support portion 135.

The support member 130 may be configured to have a planar plate shape, and may include a frame coupling portion 134 closely coupled to the frame 110 and the sensor support portion 135 spaced apart from the frame 110 by a specified distance.

At least one portion of the support member 130 may be curved and bent. The frame coupling portion 134 and the sensor support portion 135 may be distinguished from each other by the curved portion. In other words, the curved portion forms a transition region between the frame coupling portion 134 and the sensor support portion 135.

The curved portion may be configured to allow the sensor support portion 135 and the frame 110 to be spaced apart from each other by a specified distance.

As the configuration of the sensor support portion 135 may be similar to the embodiment of FIGS. 1-6, a detailed description of the support portion 135 will not be repeated.

The frame coupling portion 134 may extend from the sensor support portion 135 and may be coupled to one surface of the frame 110. Accordingly, one surface of the frame coupling portion 134 may be coupled to the frame 110, and the connection portion 145 may be coupled to the other surface of the frame coupling portion 134.

The frame coupling portion 134 may have a width similar to a width of the frame 110 or the connection portion 145, and may be fastened to the frame 110. To this end, an adhesive member may be interposed between the frame 110 and the frame coupling portion 134, but the disclosure is not limited to such a configuration.

Also, the force sensing device 200 may include at least one button 170.

The button 170 may be disposed on one side of the frame coupling portion 134, and may be used as a different input device distinguished from the force sensor 142.

A mechanically operating push button may be used as the button 170, for example. However, the button 170 is not limited to a mechanically operating push button, and various devices may be used as long as various signals may be input from an external entity. For example, a touch-type button or an input device using a wheel may be used as the button 170.

The button 170 may penetrate through the second side wall 15 and may be exposed externally of a case of the electronic device. Accordingly, a user may control the button 170 by directly contacting the button 170. However, the button 170 is not limited to such a configuration, and the button 170 may be disposed in the accommodation member 10.

The button 170 may be disposed in and mounted on a portion of the connection portion 145 coupled to the frame coupling portion 134. Also, a thickness of the button 170 may be greater than a thickness of the force sensor 142. Accordingly, a thickness of a portion of the frame coupling portion 134 on which the button 170 is mounted may be greater than a thickness of a portion of the sensor support portion 135 on which the force sensor 142 is mounted.

As illustrated in FIG. 9, in the force sensing device 100, an overall thickness T1 (hereinafter, a first thickness) of the portion on which the button 170 is mounted may be the same as or greater than an overall thickness T2 (hereinafter, a second thickness) of the portion in which the force sensor 142 is disposed.

When the first thickness T1 and the second thickness T2 are the same, the button 170 may be disposed in the accommodation member 10, and a user may operate the button 170 by applying pressure to the second side wall 15. Also, when the first thickness T1 is greater than the second thickness T2, the button 170 may penetrate through the first side wall 14 of the accommodation member 10 and may be exposed externally of the electronic device. In this case, the user may directly contact the button 170.

When the force sensing device 200 includes the button 170, an empty space may be formed between the force sensor 142 and the accommodation member 10 due to a difference in thicknesses of the button 170 and the force sensor 142. However, in the force sensing device 200, since the pressure applying member 150 is disposed in the empty space of the accommodation member 10, a portion in which the force sensor 142 is disposed may be firmly inserted into and disposed in the accommodation member 10 without clearance.

Figure 10:
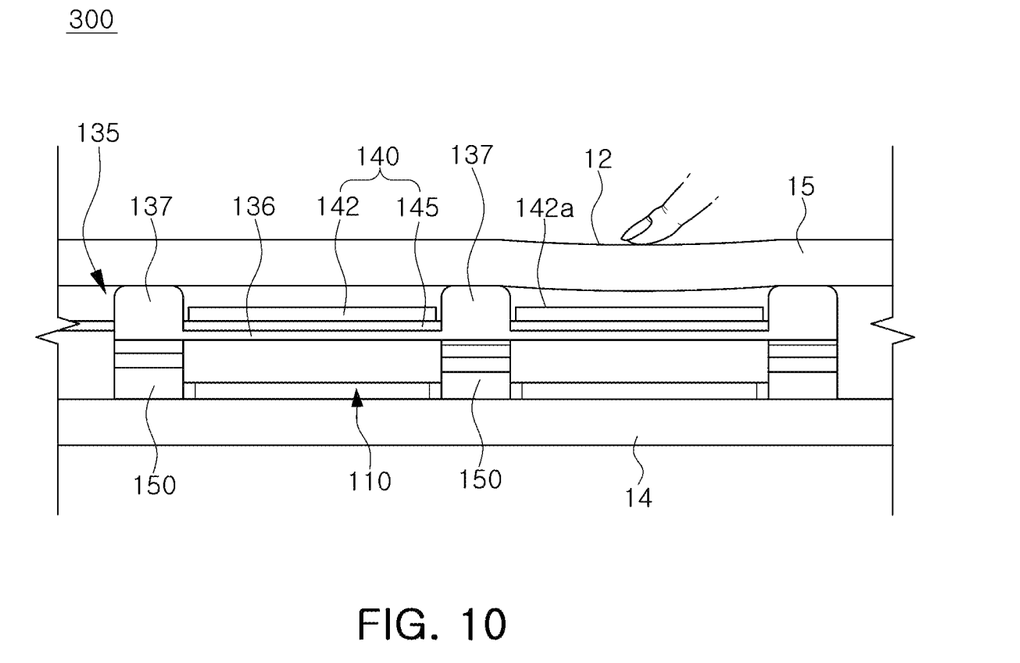
FIG. 10 is a plan diagram illustrating an electronic device, according to an embodiment.

FIG. 10 is a plan diagram illustrating an electronic device, according to an embodiment.

Referring to FIG. 10, in a force sensing device 300, two force sensors 142 may be disposed in a single sensor support portion 135, and a support projection 137 may be disposed along a boundary between the two force sensors 142. Accordingly, six support projections 137 may be provided on a single support plate 136.

In electronic device of FIG. 10, the second side wall 15 of the accommodation member 10 may be supported by the support projections 137. Accordingly, even when a user applies pressure to the pressing surface 12 to operate one of the force sensors 142, only a shape of a portion of the second side wall 15 opposing the force sensor 142 may be changed, and a spacing distance between a portion of the second side wall 15 opposing the other force sensor 142 may be maintained.

Accordingly, integration density of the force sensor 142 may increase while sensing sensitivity of the force sensor 142 is maintained.

In an example, two force sensors 142 may be disposed in a single sensor support portion 135, but the disclosure is not limited to this example, and may be varied. For example, three or more force sensors 142 may be disposed on a single sensor support plate 136, or a plurality of force sensors 142 may be disposed on a single support plate 136 in a two-dimensional arrangement.

In the aforementioned example embodiments, the pressure applying member 150 is integrated with the frame 110, but the disclosure is not limited to such a configuration. Alternatively, a pressure applying member may be integrated with the sensor support portion.

Also, in the aforementioned example embodiments, the support projection 137 may protrude from the sensor support portion 135, but the disclosure is not limited to such a configuration, and may be varied. Alternatively, a support projection may protrude from the accommodation member 10 or may be configured as an independent member.

Further, the example embodiments may be combined with one another. For example, the sensor support portions 135 described in the aforementioned example embodiments may be complexly applied to a single force sensing device.

According to the aforementioned example embodiments, because a pressure applying member is disposed between a force sensor and a frame, displacement of the force sensor may increase such that force sensing sensitivity may improve.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A force sensing device, comprising:
a sensor support portion;
at least one force sensor disposed on a first surface side of the sensor support portion;
a frame disposed on a second surface side of the sensor support portion and spaced apart from the sensor support portion; and
a pressure applying member disposed between the sensor support portion and the frame, and configured to apply pressure to the sensor support portion,
wherein the force sensing device further comprises a plurality of support projections disposed between the sensor support portion and a pressing surface, and spacing a sensing surface of the at least one force sensor apart from the pressing surface.

2. The force sensing device of claim 1, wherein the force sensing device is configured to recognize an input signal based on changes in a distance between the pressing surface of the force sensing device and the sensing surface of the at least one force sensor.

3. The force sensing device of claim 2, wherein the sensor support portion includes a support plate on which the at least one force sensor is seated, and wherein the plurality of support projections protrude from the support plate.

4. The force sensing device of claim 2, wherein the plurality of support projections are disposed to be line-symmetrical or point-symmetrical to each other with respect to a center of the at least one force sensor.

5. The force sensing device of claim 1, wherein the pressure applying member protrudes from the frame in a cantilever shape.

6. The force sensing device of claim 4, wherein, when the pressure applying member is in contact with the sensor support portion, a surface of the pressure applying member becomes a curved surface.

7. The force sensing device of claim 1, further comprising:
a frame coupling portion extending from the sensor support portion and coupled to one surface of the frame.

8. The force sensing device of claim 7, further comprising:
at least one button disposed on one side of the frame coupling portion.

9. The force sensing device of claim 8, wherein a thickness of a portion of the frame coupling portion on which the button is disposed is greater than a thickness of a portion of the sensor support portion on which the at least one force sensor is disposed.

10. The force sensing device of claim 2,
wherein the at least one force sensor comprises a plurality of force sensors disposed on the first surface side of the sensor support portion, and
wherein at least one support projection among the plurality of support projections is disposed along a boundary between the plurality of force sensors.

11. The force sensing device of claim 1, wherein the pressure applying member is disposed to be in contact with a portion of the sensor support portion that does not oppose the at least one force sensor.

12. The force sensing device of claim 1, wherein the sensor support portion has a plate shape.

13. An electronic device, comprising:
an accommodation member including a first side wall and a second side wall disposed opposite to the first side wall and having a shape configured to change by external force; and
a force sensing device disposed in the accommodation member,
wherein the force sensing device includes:
a sensor support portion spaced apart from the first side wall and having at least a portion in contact with the second side wall; and
at least one force sensor coupled to the sensor support portion,
wherein a sensing surface of the at least one force sensor is disposed opposite to the second side wall and is spaced apart from the second side wall, and
wherein the force sensing device further comprises a plurality of support projections disposed between the sensor support portion and a pressing surface, and spacing the sensing surface of the at least one force sensor apart from the pressing surface.

14. The electronic device of claim 13, further comprising:
a plurality of support projections disposed between the sensor support portion and the second side wall and spacing the sensing surface of the at least one force sensor apart from the second side wall.

15. The electronic device of claim 13, further comprising:
a frame coupling portion extending from the sensor support portion; and
at least one button disposed on one side of the frame coupling portion.

16. The electronic device of claim 15, wherein the button penetrates the second side wall, and at least one portion of the button is exposed externally of the second side wall.

17. A force sensing device, comprising:
a sensor support portion;
a force sensor disposed on a first side of the sensor support portion; and
a frame, disposed on a second side of the sensor support portion, opposite the first side, and a first portion of the frame includes at least one elastic pressure applying member,
wherein the at least one elastic pressure applying member is configured to apply pressure to the sensor support portion, and to space apart a second portion of the frame from the sensor support portion, and
wherein the force sensing device further comprises a plurality of support projections disposed between the sensor support portion and a pressing surface, and spacing a sensing surface of the force sensor apart from the pressing surface.

18. The force sensing device of claim 17, wherein the at least one elastic pressure applying member is configured to have a plate spring shape or a cantilever spring shape, and is integrally formed with the second portion of the frame or fastened to the second portion of the frame.

19. The force sensing device of claim 17, wherein the force sensing device is configured to recognize an input signal based on changes in a distance between the pressing surface of the force sensing device and the sensing surface of the force sensor.

20. The force sensing device of claim 19, wherein the force sensor is disposed inward of the plurality of support projections, and
wherein the at least one elastic pressure applying member comprises a plurality of elastic pressure applying members aligned with the plurality of support projections.

* * * * *